TRANSISTOR DIFFERENTIAL AMPLIFIER CIRCUIT

Filed Dec. 27, 1967 2 Sheets-Sheet 1

INVENTORS
MINORU NAGATA & TOSHIJIRO TAKAGI

BY Craig & Antonelli

ATTORNEYS

INVENTORS
MINORU NAGATA & TOSHIJIRO TAKAGI

BY Craig & Antonelli

ATTORNEYS 3,541,465

TRANSISTOR DIFFERENTIAL AMPLIFIER CIRCUIT

Minoru Nagata, Kodaira-shi, and Toshijiro Takagi, Musashino-shi, Japan, assignors to Hitachi, Ltd., Tokyo, Japan, a corporation of Japan Filed Dec. 27, 1967, Ser. No. 693,901

Claims priority, application Japan, Dec. 28, 1966, 42/85,340

Int. Cl. H03f *1/02;* G06f *11/00*

U.S. Cl. 330—30 3 Claims

ABSTRACT OF THE DISCLOSURE

A differential amplifier circuit, wherein an input signal is applied to at least one base of two common-emitter NPN transistors, a constant current circuit is connected to the emitters thereof, common-base NPN transistors are connected to the collectors of said former NPN transistors in cascode configuration respectively, load resistors are connected to the collectors of said common-base transistors respectively and signals differentially amplified from said input signal are derived from said collectors.

BACKGROUND OF THE INVENTION

In a differential amplifier circuit consisting of two common-emitter transistors, the emitters of said two transistors connected in common, an input signal is applied to at least one base thereof and differentially amplified signals are taken out from the respective collectors.

Such a differential amplifier circuit is particularly suitable for amplifying the potential difference between the two points separated from ground and further since said circuit has the advantage that the external induction noise is reduced, the device is suitable for a measurement or control circuit device wherein noises should be suppressed. One of the measures to judge the performance of a differential amplifier circuit and more particularly the merits or demerits of noise suppression effect is a discrimination factor $\delta$, which is defined as the ratio between the amplification gain Gd against a negative phase input or a signal component and the amplification gain Ge against an in-phase input or an unnecessary component and is represented by equation (1). And a differential amplifier circuit is considered to be better as the discrimination factor $\delta$ thereof is larger.

$$\delta=\frac{Gd}{Ge} \tag{1}$$

If, in a differential amplifier circuit composed of transistors, the inner emitter resistors of two transistors are denoted by $re_1$ and $re_2$, and the outer emitter resistor which is commonly connected to the emitters is denoted by $R_E$, said discrimination factor $\delta$ is approximated by Equation (2).

$$\delta=R_E/|re_1-re_2| \tag{2}$$

In Equation (2), since the value of $|re_1-re_2|$ is defined by a transistor used, the value of $R_E$ has conventionally been made large to enhance the discrimination factor $\delta$.

For example, a transistor constant current circuit, composed in a way that a constant voltage is applied between the base and the emitter and a constant current runs through the collector circuit thereof, is connected to a common emitter circuit of a differential amplifier circuit. In such a structure, a large collector resistance of said transistor constant current circuit is connected to said emitter circuit of the differential amplifier circuit.

However, in a conventional transistor differential amplifier circuit constructed in this way, only a discrimination factor of at most 70–90 db can be obtained and further said conventional circuit suffers from the disadvantage that the characteristics in a high frequency region above several tens of kc./sec. are unsatisfactory because of Miller effect due to the capacitance between the collector and the base of the differential amplifier circuit. Thus, further improvement has been desired.

Accordingly, a primary object of this invention is to provide a transistor differential amplifier circuit having an improved discrimination factor.

Another object of this invention is to provide a transistor differential amplifier circuit wherein high frequency characteristics are improved.

Other objects, features and advantages of this invention as well as said objects will become more apparent from the following detailed description of the principles and embodiments of this invention when taken in conjunction with the accompanying drawings.

DESCRIPTION OF THE PREFERRED EMBODIMENTS

A transistor differential amplifier circuit according to this invention is characterized in that the differential amplifier circuit is composed of a pair of transistor circuits in cascode configuration and such composition is based on the following considerations.

According to Equation (2) presented hereinabove, when the resistance of the outer emitter resistance $R_E$ becomes infinite, the discrimination factor $\delta$ seemingly becomes infinitely large, but in actuality, the value of $\delta$ is limited to some finite value by various causes.

Figure 1:
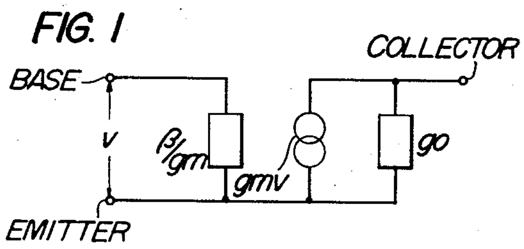
FIG. 1 is an equivalent circuit diagram of a common-emitter transistor composing a differential amplifier circuit.

Now, if each of two amplifying transistors whose emitters are connected to each other and which compose a differential amplifier is represented by the equivalent circuit as shown in FIG. 1 and the parameters of the transistor are denoted in the following way, $\beta$: current amplification factor of a transistor
$g_m$: mutual conductance of a transistor
$g_o$: output conductance of a transistor
$v$: emitter-base applied voltage of a transistor
$\Delta g_m$: variance of the mutual conductance of said two transistors, and
$\Delta g_o$: variance of the output conductance of said two transistors, then the inverse of said infinite discrimination factor $\delta$ is given by the following formula, $$\frac{1}{\delta}\simeq\frac{g_o}{g_m}\left(\frac{\Delta g_m}{g_m}+\frac{\Delta g_o}{g_o}\right) \tag{3}$$

It is understood from this formula that the conditions to increase the discrimination factor $\delta$ are $$\Delta g_0, \Delta g_{m0} \rightarrow 0 \quad (4)$$

$$g_0 \ll g_m \quad (5)$$

Among said two conditions, the condition of Equation (4) is restricted by the transistor used and it is difficult to change this condition by the design of a circuit. Thus, the improvement of the discrimination factor $\delta$ of a transistor differential amplifier circuit is done by paying attention to the condition of Equation (5) in this invention.

In order to achieve the condition of Equation (5), a transistor circuit of cascode configuration is employed instead of a conventional common-emitter configuration amplifying transistor in this invention. Said cascode configuration transistor circuit is formed by connecting an emitter of a common base configuration transistor, having substantially the same value of $g_m$ as a common emitter configuration transistor and a value of $g_o$ smaller by 1/10~1/100 than that of a common emitter configuration transistor circuit, in series to a collector of a common emitter configuration transistor.

Figure 2:
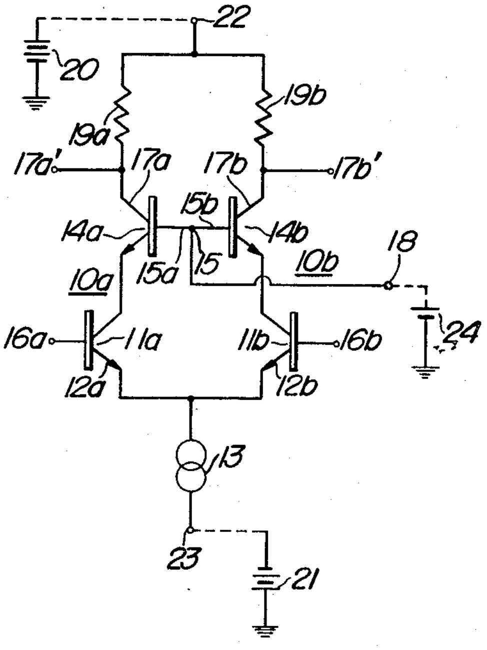
FIG. 2 is a circuit diagram showing the fundamental structure of a transistor differential amplifier circuit according to this invention.

A transistor differential amplifier circuit of this invention is composed as shown schematically in FIG. 2. Namely, the emitters 12*a*, 12*b* of common emitter transistors 11*a*, 11*b* in a pair of cascode configuration transistor circuits 10*a*, 10*b* are coupled in common and connected to a terminal 23 of a power supply 21 by way of a constant current circuit 13 having a high output impedance, an input signal is applied to at least one base 16*a* (or 16*b*), the base terminals 15*a*, 15*b* of the common base configuration transistors 14*a*, 14*b* connected in cascode configuration to said transistors 11*a*, 11*b* respectively are mutually coupled and connected to a low impedance point having a fixed potential 18 in order to satisfy the condition of common base configuration and the operating condition of a cascode configuration transistor circuit, the collectors 17*a*, 17*b* of the transistors 14*a*, 14*b* are connected to a terminal 22 of a power supply 20 by way of load resistors 19*a*, 19*b* and output signals differentially amplified from the input signal are derived from the collector terminals 17*a'*, 17*b'*.

Though said point of fixed potential 18 is equivalently shown by a battery 24, a practical way of selection in an actual circuit will become more apparent from the following description of the circuits embodying this invention.

Figure 3:
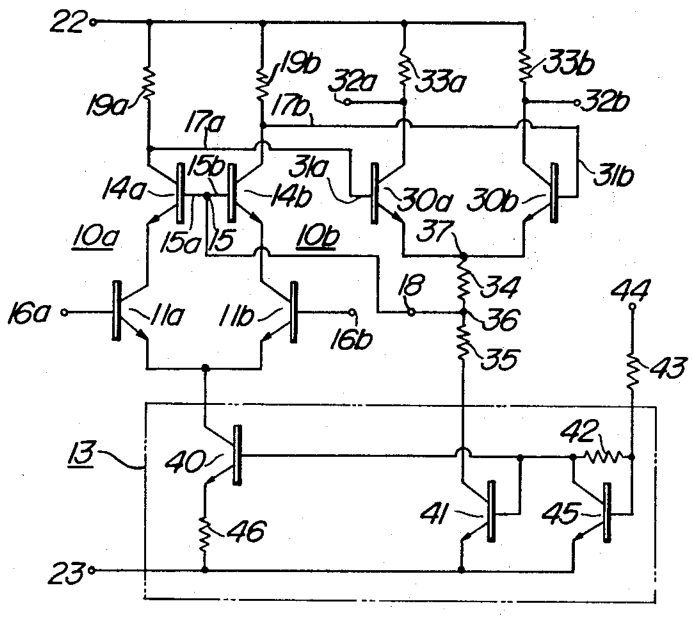
FIG. 3 is a circuit diagram of a transistor differential amplifier circuit embodying this invention.

FIG. 3 shows a circuit wherein this invention is applied to a multi-stage differential amplifier circuit. In this circuit, a first differential amplifier stage is composed in the same way as shown in FIG. 2. Collector output signals from transistors 14*a*, 14*b* are fed to the bases 31*a*, 31*b* of transistors 30*a*, 30*b* constituting a second differential amplifier stage, further amplified therein and taken out from collector output terminals 32*a*, 32*b*. Reference numerals 33*a*, 33*b* designate load resistors of the second amplifier stage. To the emitter circuits of the first and second differential amplifier stages are connected collectors of transistors 40, 41 composing a constant current circuit 13. The base and collector of a transistor 45 are connected through a resistor 42, the base thereof is connected to a terminal 44 of a power supply through a resistor 43 and a constant voltage is supplied to each base-emitter of said transistors 40, 41. Thus, said assembly is operated as a constant current circuit. The emitter circuit of the transistor 40 comprises a resistor 46 and thereby a constant current different from the one obtained with the transistor 41 can be obtained from the transistor 40.

In the first differential amplifier stage, the point of fixed potential 18 for connecting a base connection 15 of the transistors 14*a*, 14*b* composed in cascode configuration is generally defined in the following way.

If the base potentials of the transistors 11*a*, 11*b* is denoted by $V_{in}$, the base potential of the transistors 14*a*, 14*b* is denoted by $V_B$, the potential difference in the emitter-to-base potential is denoted by $V_{be}$ and the collector potential is denoted by $V_{out}$, the value of $V_B$ must satisfy the following Formula 6.

$$V_{in} + V_{be} \leq V_B \leq V_{out} \quad (6)$$

Further, if the impedance of a power supply which supplies a base potential is denoted by $R_3$ and the input impedance of the transistor 14*a* or 14*b* seen from the base terminal thereof is denoted by $Z_{in}$, the value of $R_B$ must satisfy the following Formula 7.

$$R_B \leq Z_{in} \quad (7)$$

In this embodiment, said point of fixed potential is defined by a midpoint 36 of the connection between the low resistance resistors 34 and 35 inserted into the emitter circuit of the second differential amplifier stage. In this case, a collector bias for said transistors 14*a*, 14*b* is obtained from the potential drop in the resistor 34.

The circuit of this embodiment wherein the second amplifier stage works as a differential amplifier circuit is particularly suitable for the application of this invention, because the emitter connection point 37 in said second amplifier stage has a completely fixed DC potential and a fixed potential point suitable for a base or collector bias potential for the transistors 14*a*, 14*b* can be obtained simply by inserting a low resistance resistor 34 into the emitter circuit.

Figure 4:
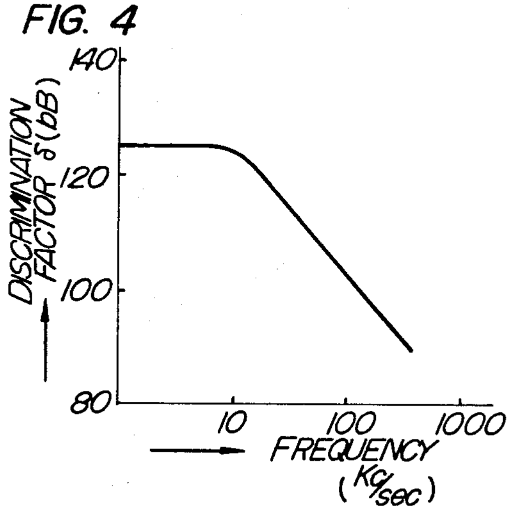
FIG. 4 is a diagram showing the frequency characteristics of the discrimination factor obtained with said circuit embodying this invention.

In the circuit of this embodiment, since the first stage differential amplifier circuit is driven with a constant current, the resistance corresponding to $R_E$ in Equation 2 becomes nearly infinite and further since the amplifying transistors of said amplifier circuit are of cascode compound transistor structure respectively, the output conductance $g_0$ becomes small and accordingly the discrimination factor $\delta$ is remarkably improved. Further, since the Miller effect is absent, the frequent characteristic is also improved. For example, as shown in FIG. 4, a discrimination factor of 100~120 db is obtained up to several tens of kc./sec. and a discrimination factor of more than 80 db can be obtained even in the region of several hundred kc./sec. and unstable operations like oscillation hardly appear.

It is to be noted that a practically usable bias potential can be provided between the base and collector of the first stage cascade configuration transistors 14*a*, 14*b* even without the resistor 34 because a potential difference of about 0.8 v. exists in the emitter-to-base potential of the transistors 31*a*, 31*b*. In this case, the DC potential point of the emitter connection point 37 in the second amplifier stage is automatically fixed only if the first differential amplifier stage is driven with a constant current.

Figure 7:
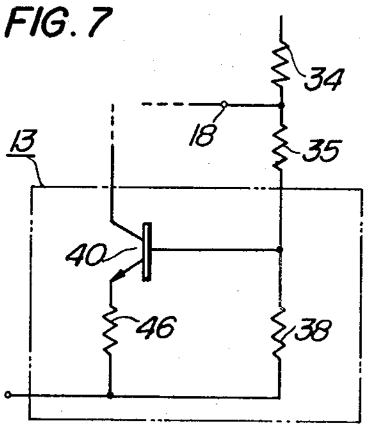
FIG. 7 is a circuit diagram of another embodiment of a constant current circuit for use in a circuit of this invention.

As shown in FIG. 7, the constant current circuit 13 may be composed into a structure making use of so-called common mode feedback technology, wherein the resistor 38 detects the change of the emitter current in the circuit of the following stage and the detected change is fed back into the base of the transistor 40.

Figure 5:
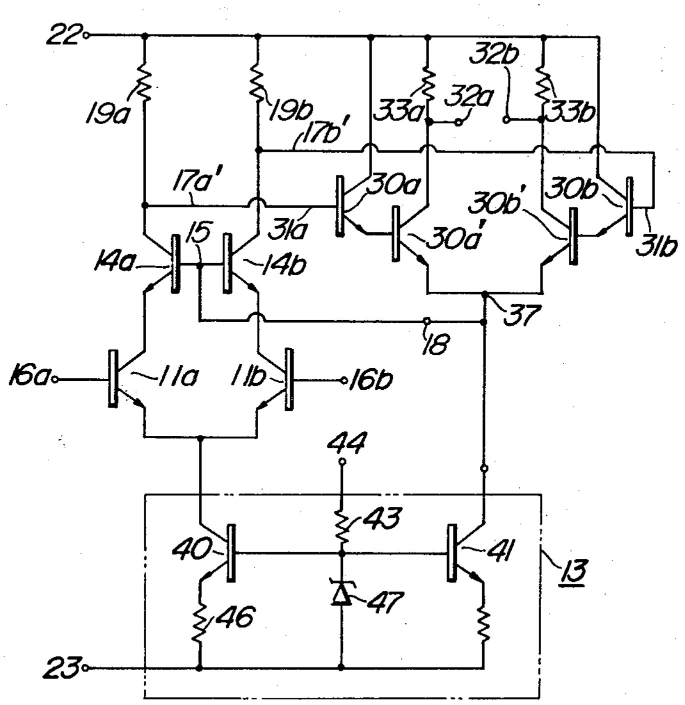
FIG. 5 is a circuit diagram of another transistor differential amplifier circuit embodying this invention.

FIG. 5 shows another circuit embodying this invention wherein a second stage differential amplifier circuit is composed of a pair of transistors of Darlington configuration 30*a*, 30*a'* and 30*b*, 30*b'*. In the circuit of this embodiment wherein the output from the first stage circuit is received by a Darlington configuration differential amplifier circuit, the high impedance of the Darlington configuration differential amplifier circuit is connected in parallel with the load resistors 19*a*, 19*b* in the first stage. Thus, the signal amplification factor of the first stage circuit increases and the drift and the discrimination factor are improved further. Further, since the potential difference appearing between the bases 31*a*, 31*b* and the emitter 37 of the second stage amplifier circuit is made twice larger than the case in which a pair of single transistors are used by composing said second amplifier circuit stage, a sufficient bias voltage can be obtained between the collector and the base of the common base configuration transistors 14_a_, 14_b_ in the first stage circuit when said emitter 37 is chosen as the point of fixed potential 18. In this embodiment, there is shown a case where the bases and emitters of the transistors 40 and 41 are driven with a constant voltage diode 47 in the constant current circuit 13. It is evident that various forms of circuits other than the one shown in the drawing can be used as the constant current circuit 13.

In the first and second embodiments described hereinabove, the point of fixed potential 18 for supplying a base voltage to the common base configuration transistors 14_a_, 14_b_ in the first stage differential amplifier circuit can be obtained easily from the emitter circuit of the second stage differential amplifier circuit.

Figure 6:
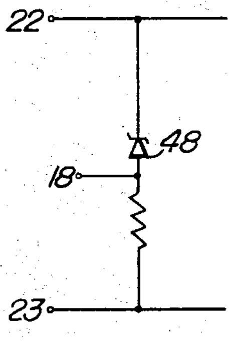
FIG. 6 is an auxiliary diagram illustrating another modified version of this invention.

When the second stage circuit is not composed of a differential amplifier circuit, it is preferable to obtain said point of fixed potential 18, for example, from a circuit comprising a constant voltage diode 48 formed between the power supply terminals 22 and 23 as shown in FIG. 6.

As has been fully described hereinabove, since a differential amplifier circuit is composed of cascode configuration compound transistors according to this invention, the base-collector capacitance $C_c$ of the transistors 11_a_, 11_b_ for amplifying signals does not impose an influence on the characteristics of the circuit essentially and the junction areas of the emitters and collectors of said transistors 11_a_, 11_b_ may be made relatively large. Further, the inequality of the area of the emitters and collectors of the common base configuration transistors 14_a_, 14_b_ to be connected in series to said transistors 11_a_, 11_b_ does not provide a serious problem and so even small sized transistors may be used satisfactorily.

Such a differential amplifier circuit of this invention can be composed not only of bipolar transistors, but also of field effect transistors. In either case, the integration of the semiconductor circuits is simple because of the simplicity of the structure. In this case, since transistors having a substantially equal area wherein characteristics like the emitter-to-base voltage $V_{BE}$ are uniform can be provided as the amplifying transistors 11_a_, 11_b_, an excellent circuit wherein signal drift, signal offset or the like is absent and which is quite stable against noise can be obtained.

What is claimed is:

1. Transistor differential amplifier comprising: a pair of first transistors forming a first stage amplifier the emitters of which are commonly connected to each other; means for applying an input signal between the bases of said first transistors; first constant current means commonly connected to both the emitters of said first transistors for regulating the common emitter current of said first transistors to be constant; a pair of second transistors the emitters of which are connected to the collectors of said first transistors respectively; first output means including a pair of load elements connected to the collectors of said second transistors respectively for providing a first output signal between the collectors of said second transistors; a pair of third transistors for forming a second stage amplifier the emitters of which are commonly connected to each other; means for connecting the collectors of said second transistors with the bases of said third transistors respectively to supply the second stage amplifier with the first output signal; second constant current means commonly connected to both the emitters of said third transistors for regulating the common emitter current thereof to be constant; second output means including a pair of second load elements connected to the collectors of said third transistors respectively for providing a second output signal between the collectors of said third transistors; and connecting means for connecting the respective bases of said second transistors in common to the intermediate between the commonly connected emitters of the third transistors and said second constant current means, thereby increasing the discrimination factor of the differential amplifier.

2. Transistor differential amplifier device according to claim 1, wherein said first, second and third transistors are of the same conductivity type.

3. Transistor differential amplifier device comprising: a pair of first transistors forming a first stage amplifier the emitters of which are commonly connected to each other; means for applying an input signal between the bases of said first transistors; first constant current means commonly connected to both the emitters of said first transistors for regulating the common emitter current of said first transistors to be constant; a pair of second transistors the emitters of which are connected to the collectors of said first transistors respectively; first output means including a pair of load elements connected to the collectors of said second transistors respectively for providing a first output signal between the collectors of said second transistors; a pair of third transistors forming a second stage amplifier the bases of which are connected to the collectors of said second transistors respectively so that the first output signal may be supplied to the second stage amplifier; a pair of fourth transistors the bases of which are connected to the emitters of said third transistors to form a Darlington configuration therewith respectively and the emitters of which are commonly connected to each other; second constant current means commonly connected to both the emitters of said fourth transistors for regulating the common emitter current thereof to be constant; second output means including a pair of second load elements connected to the collectors of said fourth transistors respectively for providing a second output signal between the collectors of said fourth transistors; and connecting means for connecting the respective bases of said second transistors in common to the intermediate between the commonly connected emitters of the fourth transistors and the second constant current means.

References Cited

UNITED STATES PATENTS

| | | | |
|---|---|---|---|
| 2,780,682 | 2/1957 | Klein | 330—69 |
| 2,896,031 | 7/1959 | Young | 330—69 |
| 3,213,290 | 10/1965 | Klein et al. | 307—223 |

NATHAN KAUFMAN, Primary Examiner

U.S. Cl. X.R.

330—16